(12) United States Patent
Hashimoto et al.

(10) Patent No.: US 7,142,476 B2
(45) Date of Patent: Nov. 28, 2006

(54) REFRESH COUNTER CIRCUIT AND CONTROL METHOD FOR REFRESH OPERATION

(75) Inventors: Takeshi Hashimoto, Tokyo (JP); Masayuki Kaneda, Tokyo (JP)

(73) Assignee: Elpida Memory Inc., Tokyo (JP)

( * ) Notice: Subject to any disclaimer, the term of this patent is extended or adjusted under 35 U.S.C. 154(b) by 3 days.

(21) Appl. No.: 11/151,553

(22) Filed: Jun. 14, 2005

(65) Prior Publication Data

US 2006/0002221 A1 Jan. 5, 2006

(30) Foreign Application Priority Data

Jun. 18, 2004 (JP) ............................. 2004-181453

(51) Int. Cl.
*G11C 7/00* (2006.01)
(52) U.S. Cl. ............ 365/222; 365/230.03; 365/230.08; 365/230.09; 711/209
(58) Field of Classification Search ................ 365/222, 365/230.01, 230.03, 238.08, 230.09; 711/209, 711/105
See application file for complete search history.

(56) References Cited

U.S. PATENT DOCUMENTS 5,999,473 A * 12/1999 Harrington et al. ......... 365/222
6,134,168 A * 10/2000 Harrington et al. ......... 365/222
6,795,362 B1 * 9/2004 Nakai et al. ................ 365/222
7,017,027 B1 * 3/2006 Inaba et al. ................. 711/219

FOREIGN PATENT DOCUMENTS

JP          20004-118938        4/2004

* cited by examiner

*Primary Examiner*—Anh Phung
*Assistant Examiner*—Toan Le
(74) *Attorney, Agent, or Firm*—McDermott Will & Emery LLP

(57) ABSTRACT

A refresh counter circuit generating a row address during refresh operation for the memory device which has a normal area for storing data bits and a parity area for storing parity bits, including; n-stage counter which generates the row address corresponding to an address space of the normal area represented by n bits and the parity area represented by m (m<n) bits; an area discriminating circuit which generates an area discriminating signal; a first switching circuit for switching between a first connected state in which all stages of the counter are connected and a second connected state in which a n–m bits counter portion is disconnected from the counter; and an automatic reset circuit which generates a reset signal so that the count operation in the normal area is discriminated by the discriminating signal when stopping of the refresh operation in the second connected state.

11 Claims, 12 Drawing Sheets

FIG.8

CONDITIONS FOR SWITCHING OF EACH PASS SWITCH

| SWITCH \ SIGNAL | AREA DISCRIMINATION BIT X13 | | MODE CONTROL SIGNAL Sm | |
|---|---|---|---|---|
| | 0 | 1 | 0 | 1 |
| PATH SWITCH 31 | ON | OFF | — | — |
| PATH SWITCH 32 | ON | OFF | — | — |
| PATH SWITCH 33 | OFF | ON | — | — |
| PATH SWITCH 34 | — | — | OFF | ON |

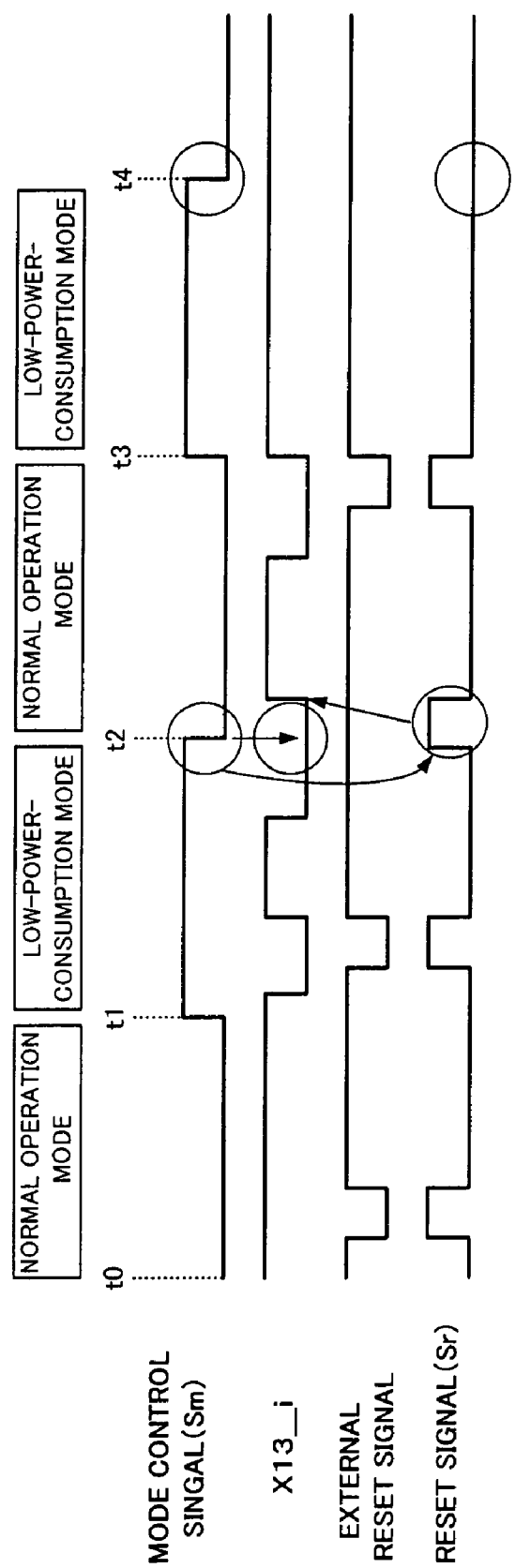

REFRESH COUNTER CIRCUIT AND CONTROL METHOD FOR REFRESH OPERATION

BACKGROUND OF THE INVENTION

1. Field of the Invention

The present invention relates to a refresh counter circuit used for refresh operation in a semiconductor memory such as a DRAM (dynamic random access memory), and a control method for the refresh operation, and, more particularly, relates to a technical field for, for example, a refresh counter circuit by which the refresh operation is controlled in a longer period than that of normal operation in order to realize further less power consumption, wherein the refresh counter circuit is used for refresh operation in a memory array including a normal area and a parity area.

2. Related Art

Conventionally, refresh operation has been required to be controlled in a longer period than that of normal operation in order to realize further less power consumption in a data holding state of a DRAM. Thereby, there has been proposed a configuration in which an error correction function using parity bits are installed in the DRAM to correct bit errors which are increased as the period of the refresh operation is made longer. In the DRAM with the above-described configuration, it is required to provide a normal area which stores data bits input to a memory device, and a parity area which stores the above-described parity bits, and a refresh counter which can be applied to the both normal and parity areas during refresh operation is demanded to be prepared. For example, a configuration disclosed in Japanese Patent Laid-Open Application No. 2004-118938 can be given as one example.

In the configuration disclosed in Laid-Open Application No. 2004-118938, a refresh counter corresponding to a 13-bit address space for row addresses in the memory device is included, and a switch is controlled in such a way that all the 13 bits are connected during refresh operation in the normal area, and, on the other hand, eight bits among 13 bits are connected during refresh operation in the parity area. Thereby, a circuit can be used in common for a circuit for the normal area and that for the parity area to control the refresh operation without enlarging the circuit scale of the refresh counter.

Moreover, the configuration and the size of the address space for the normal area are different from those for the parity area in the configuration of Japanese Laid-Open Application No. 2004-118938, wherein the refresh counter performs count-up operation in the normal area and the parity area. In this case, a preferable configuration is that an area discriminating circuit, which generates a signal discriminating the normal area from the parity area, is added to, for example, a final stage of the refresh counter, and an area in which the count operation is performed can be decided.

In the above-described conventional configuration, a counter portion for five bits among counter used in the normal area becomes an indefinite area in the parity area. Accordingly, when the operation mode requiring refresh operation in the parity area is temporarily stopped while the operation mode is executed (an operation such as Exit operation and Entry operation from the later-described burst refresh process, or a power-off state), it is required to avoid the subsequent restarting of refresh operation in the parity area as the indefinite area remains unclear. As one measure for the above requirement, it is considered that stopping of the operation mode is disabled while the refresh operation is executed in the parity area.

However, the above-described operation mode is considered to include long-time processing with comparatively large loading, such as encode process before the refresh operation in a longer period. Moreover, the operation mode is also required to have a lower internal-clock speed in order to realize less power consumption. In this case, as delay in the subsequent operation is caused by an operation in which stopping of the operation mode is disabled during refresh operation in the parity area, it is preferable from the viewpoint of rapid control to have a specification in which stopping of the operation mode is enabled at any time. When the above-described stopping of the operation mode is caused, a problem is that one measure is required to avoid a situation in which a refresh counter is set in an indefinite area of the parity area at the subsequent restarting of the operation mode.

BRIEF SUMMARY OF THE INVENTION

An object of the present invention is to realize a configuration of a refresh counter circuit which generates row addresses in both a normal area and a parity area, wherein, according to the configuration, a situation that a refresh counter is set in an indefinite area is avoided when refresh operation in a parity area is temporarily stopped, and, thereafter, the refresh operation is restarted, and a malfunction which may be generated during the refresh operation can be adequately prevented in a small-scale circuit configuration without restricting operations.

A refresh counter circuit according to an aspect of the present invention which generating a row address of a memory device during refresh operation for said memory device which has a normal area for storing data bits, and a parity area for storing parity bits used for detection and correction of error bits among said data bits, comprising; n-stage counter which generates said row address corresponding to an address space of said normal area represented by n bits and to an address space of said parity area represented by m (m<n) bits included in said n bits; an area discriminating circuit which is connected to said n-stage counter and generates an area discriminating signal for discriminating between count operation in said normal area and that in said parity area; a first switching circuit which controls switching between a first connected state in which all stages of said n-stage counter are connected, and a second connected state in which a counter portion corresponding to (n−m) bits which, among said n bits, are not included in said m bits, is disconnected from a path of said n-stage counter to form a m-stage counter; and an automatic reset circuit which generates a reset signal for resetting a state of said discriminating signal so that said count operation in said normal area is discriminated by said discriminating signal, and supplies said reset signal to said area discriminating circuit, when stopping of said refresh operation is instructed under a situation that said first switching circuit controls switching to said second connected state.

According to the aspect of the present invention, n-stage counter in a refresh counter circuit can be used in common for refresh operation both in a normal area and in a parity area, and an area discriminating signal can decide which area is to be counted up. Moreover, both an n-bit row address in the normal area and an m (m<n)-bit row address in the parity area can be generated through switching control of a connected state with the first switching circuit. An indefinite area exists because an address space is smaller in the parity area than that of the normal area. Furthermore, the area discriminating signal generates a reset signal in such a way that the normal area is specified for count operation when a situation that refresh operation is required to be stopped is caused during count operation for the row address in the parity area. Thereby, it can be avoided that the refresh operation is restarted thereafter in a state in which the row address is in the indefinite area, there can be prevented beforehand a malfunction that there remains in a address space a portion which has not been refreshed, and stopping of the refresh operation during count operation for the row address in the parity area is not required to be disabled. Accordingly, a small-scale refresh counter circuit with high degree of flexibility in control can be realized.

In the refresh counter circuit according to an aspect of the present invention, said first switching circuit controls switching to said first connected state when said count operation in said normal area is discriminated by said area discriminating signal, and said first switching circuit controls switching to said second connected state when said count operation in said parity area is discriminated by said area discriminating signal.

In the refresh counter circuit according to an aspect of the present invention, a first operation mode in which said refresh operation is executed using only said row address in said normal area, or a second operation mode in which said refresh operation is executed using said row address both in said normal area and in said parity area, can be selectively instructed to said memory device, and said automatic reset circuit generates said reset signal when said operation mode is shifted from said second operation mode to said first operation mode.

In the refresh counter circuit according to an aspect of the present invention, further comprising a second switching circuit which disconnects said n-stage counter from said area discriminating circuit when said first operation mode is instructed, and connects said area discriminating circuit to final stage of said n-stage counter to form (n+1) stage counter when said second operation mode is instructed.

In the refresh counter circuit according to an aspect of the present invention, said first switching circuit includes a first path switch connected between the output side of the k-th (k<m) stage and the input side of the (k+1)-th stage among said n-stage counter, a second path switch connected between the output side of the (k+n−m)-th stage and the input side of the (k+n−m+1)-th stage among said n-stage counter, and a third path switch connected between the output side of the k-th stage and the input side of the (k+n−m+1)-th stage among said n-stage counter, wherein in said first connected state, said first path switch and said second path switch are controlled to be turned on, and the third path switch is controlled to be turned off, and in said second connected state, said first path switch and said second path switch are controlled to be turned off, and said third path switch is controlled to be turned on.

In the refresh counter circuit according to an aspect of the present invention, said second switching circuit includes a fourth path switch connected between the output side of the n-th stage of said n-stage counter and the input side of said area discriminating circuit, said fourth path switch is controlled to be turned off when said first operation mode is instructed, and said fourth path switch is controlled to be turned on when said second operation mode is instructed.

In the refresh counter circuit according to an aspect of the present invention, each of said path switches comprises a complementary-type transfer gate including PMOS and NMOS.

In the refresh counter circuit according to an aspect of the present invention, said automatic reset circuit supplies an external reset signal input from the outside, in addition to said reset signal, to said area discriminating circuit.

A control method for refresh operation according to an aspect of the present invention by which a row address is generated for a memory device having a normal area storing data bits, and a parity area storing parity bits used for detection and correction of error bits among said data bits, including; generating said row address corresponding to an address space of said normal area represented by n bits and to an address space of said parity area represented by m (m<n) bits included in said n bits; generating an area discriminating bit for discriminating between count operation in said normal area and that in said parity area; controlling switching between a first state in which said row address of said n bits is used, and a second state in which said m-bit row-address is used wherein a row-address portion corresponding to (n−m) bits which, among said n bits, are not included in said m bits, is separated from the whole row address; resetting said area discriminating bit so that said count operation in said normal area is discriminated by said area discriminating bit when stopping of said refresh operation is instructed under a situation that said second state is controlled to be switched.

In the control method for refresh operation according to an aspect of the present invention, said first state is controlled to be switched when said count operation in said normal area is discriminated based on said area discriminating bit, and said second state is controlled to be switched when said count operation in said parity area is discriminated based on said area discriminating bit.

In the control method for refresh operation according to an aspect of the present invention a first operation mode in which said refresh operation is executed using only said row address in said normal area, or a second operation mode in which said refresh operation is executed using said row address both in said normal area and in said parity area, can be selectively instructed to said memory device, and said resetting is performed when said operation mode is shifted from said second operation mode to said first operation mode.

As described above, the present invention has a configuration in which, when switching control of a connected state of the refresh counter which generates row addresses in both the normal area and the parity area is performed according to address spaces in the normal area or in the parity area, and when refresh operation is temporarily stopped at the timing when a row address in the parity address is counted up, a reset signal is generated so that the area discriminating signal discriminates the normal area. Thereby, there can be avoided a situation that the refresh counter is set in an indefinite area when refresh operation is restarted after the reset signal is generated. Accordingly, there can be provided a refresh counter circuit and the like according to which a malfunction, for example, a situation that there is generated a portion in which refresh operation has not been executed, can be prevented, and refresh operation suitable for less power consumption can be performed in a simple circuit configuration thorough control with high degree of flexibility and without restricting the operations.

BRIEF DESCRIPTION OF THE DRAWINGS

FIG. 8 is a view showing conditions on which switching of the path switches shown in FIG. 7 is controlled;

FIG. 12 is a waveform diagram for functions of the automatic reset circuit shown in FIG. 11.

DETAILED DESCRIPTION OF THE INVENTION

A preferable embodiment of the present invention will be explained with reference to drawings. In the embodiment, the invention is applied to a DRAM with a configuration in which, in order to realize less power consumption, a circuit with an error correction function is installed to control refresh operation with a long period.

Figure 1:
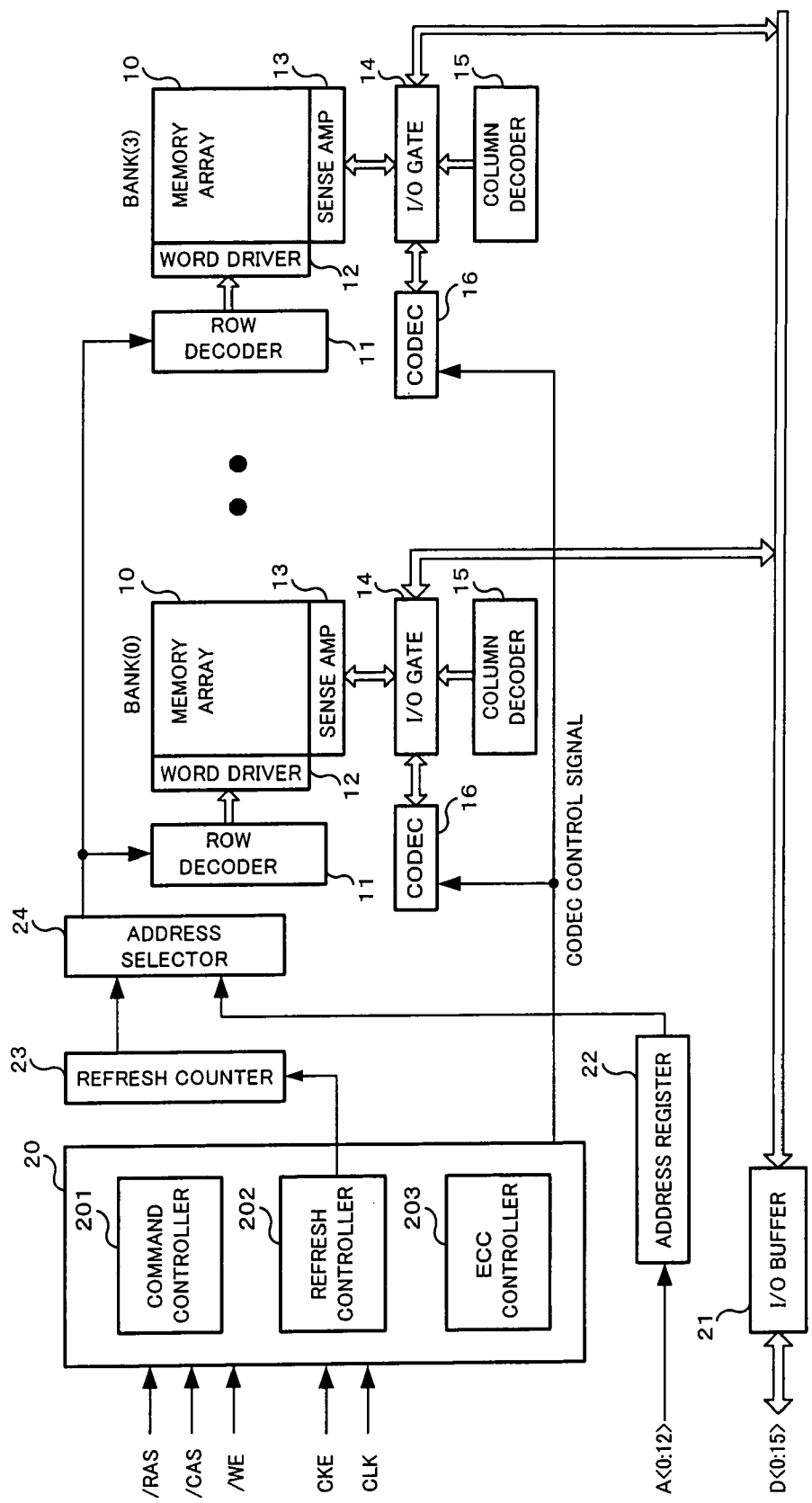
FIG. 1 is a block diagram showing a whole configuration of a DRAM according to an embodiment of the present invention.

FIG. 1 is a block diagram showing an entire configuration of the DRAM according to the embodiment. Hereinafter, a DRAM with a storage capacity of 256 Mbits will be explained as one example. The DRAM shown in FIG. 1 is provided with four memory arrays 10 corresponding to four banks 0 to 3, and a row decoder 11, a word driver 12, a sense amplifier 13, an I/O gate 14, a column decoder 15, and a codec 16 are provided around each memory array 10. The DRAM shown in FIG. 1 is further provided with a control circuit 20, an I/O buffer 21, an address register 22, and an address selector 24.

In the above-described configuration, each memory array 10 has an arrangement in the form of a matrix in a row direction and a column direction, and has a normal area which stores normal data bits and a parity area which stores parity data bits which are used for error detection and correction of error bits, among data bits, generated while refresh operation with a longer period is executed. The four memory arrays 10 corresponding to the four banks 0 to 3 have the same configuration respectively. The row decoder 11, the word driver 12, the sense amplifier 13, the I/O gate 14, the column decoder 15, and the codec 16 which are provided around the memory arrays 10 have the same configurations for the four banks 0 to 3.

Desired row and column addresses to be accessed are designated for each memory array 10, based on control commands instructing operations to perform. The row decoder 11 selects one word line (not shown) designated by a later-described row address. The word driver 12 drives the word line selected by the row decoder 11 to a selection level.

On the other hand, the sense amplifier 13 amplifies a voltage difference generated on complementary data lines (bit lines) in response to read data from memory cells connected to the word line driven to the selection level, and outputs the amplified voltage difference to the I/O gate 14. The column decoder 15 selects a column corresponding to the column address designated as described above, and data of the selected column is transmitted from the I/O gate 14 to the I/O buffer 21. When the memory array 10 is accessed, the I/O buffer 21 functions as a buffer which inputs or outputs 16-bit data D<0:15> between an external circuit and the I/O gate 14.

The codec 16 is an operation means which generates parity bits, and corrects error bits, and includes, for example, a multistage shift register which can calculate a generator polynomial based on a cyclic Hamming code. During the later-described encode process, the codec 16 generates parity bits to be stored in the parity area, based on data bits. Moreover, during the later-described decode process, the codec 16 detects and corrects error bits, based on data bits and parity bits.

The control circuit 20 controls various kinds of operations in the DRAM according to the embodiment, and also controls internal timing in each component shown in FIG. 1. The control circuit 20 includes a command decoder 201 which discriminates control commands for the DRAM, a refresh controller 202 which controls refresh operation in the DRAM, and an ECC (Error Correcting Code) controller 203 which controls an error correction function for the memory array 10 in the above-described codec 16.

Control signals supplied from the outside to the control circuit 20 includes a row address strobe signal (/RAS), a column address strobe signal (/CAS), a write enable signal (/WE), a clock enable signal CKE, and a clock signal CLK (Note that a symbol "/" indicates that a signal becomes active at a low level). Also, a 13-bit address signal A<0:12> is input to the address register 22. The control commands input from the outside are defined by a combined pattern of the above-described control signals, and the command decoder 201 discriminates the kind of a control command, based on the combined pattern.

The refresh controller 202 controls refresh operation in a data holding state of the DRAM, and starts the refresh counter 23 at a starting time. The refresh counter 23 generates row addresses for refresh operation, counts up the a row address one by one, and outputs the counted value to the address selector 24. A row address output from the address register 22 and a row address output from the refresh counter 23 are input to the address selector 24, and one of the both addresses is selectively supplied to the row decoder 11, depending on a state in which the DRAM is operated.

In the embodiment, the refresh counter 23 is required to perform count-up operation not only in the normal area, but also in the parity area, because errors are detected and corrected when the refresh operation using a longer period than that of normal operation is executed, as described later. A concrete configuration and operations of the refresh counter 23 will be described later.

Next, an address space corresponding to row addresses of the memory array 10 will be explained. In the embodiment, a 13-bit row address X0 to X12 is used in order to access an arbitrary row in the 256-Mbits memory array 10. Moreover, an area discriminating bit X13, by which one of the above-described normal area or the parity area is designated, is added to the row address. Accordingly, a 14-bit row address X0 to X13 is used during refresh operation.

Figure 2:
FIG. 2 is a view explaining an address space defined by a row address X0 to X13.

FIG. 2 is a view explaining an address space defined by the 14-bit row address X0 to X13. The normal area is designated in the case of X13=0, and the parity area is designated in the case of X13=1, based on the area discriminating bit X13 of the most significant bit of the row address. When the normal area is designated, the address space is represented, based on all the bits of 13-bit row addresses X0 to X12. Accordingly, the normal area has an address space with 8192 rows (X) corresponding to 2 to the 13th power different addresses.

On the other hand, when the parity area is designated, the address space is represented, based on a total of 8 bits including 4 bits of X9 to X12 of the row address, and 4 bits of X0 to X3 of the row address. That is, 5 bits of X4 to X8 of the row address are not used for the parity area. Thereby, the size of the parity area is one thirty-second of the size of the normal area because the parity area has an address space of 256 rows (X) corresponding to 2 to the 8th power addresses.

Figure 3:
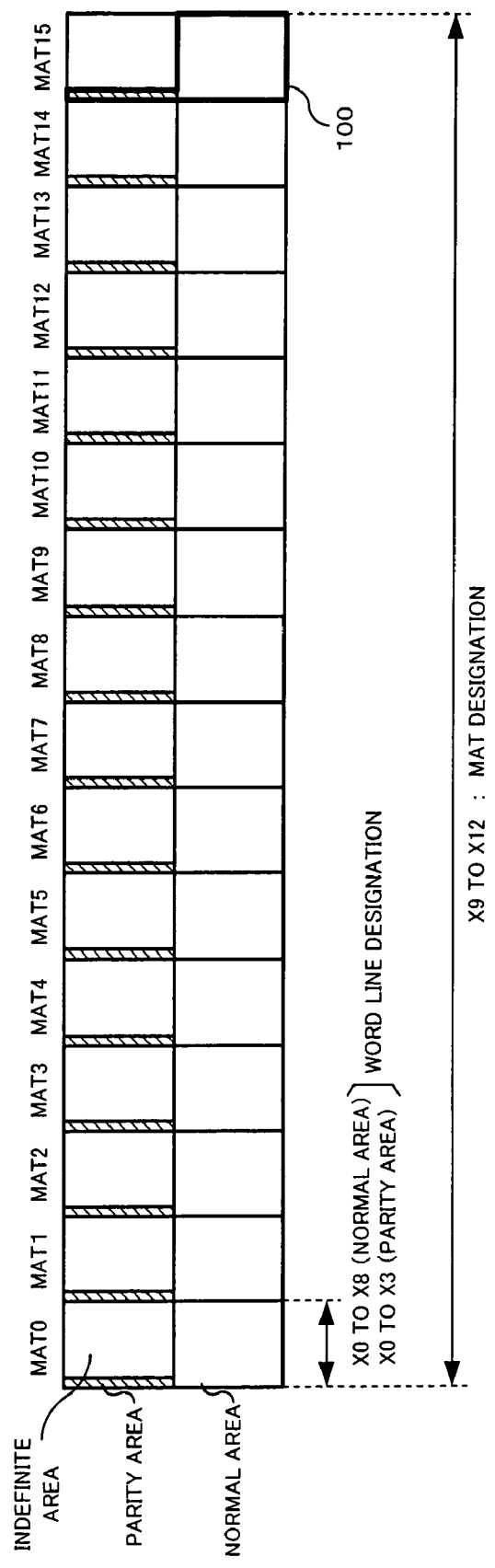
FIG. 3 is a view showing a relation between the address space of the row addresses and the mat configuration for the memory array.

Here, a relation between a memory space of row address X0 to X13 and a mat configuration for the memory array 10 will be explained with reference to FIG. 3. In the DRAM in the embodiment, each memory array 10 is divided to comprise 16 mats 100. FIG. 3 shows relations between normal areas and parity areas, wherein the both areas corresponds to each mat in the memory array 10 comprising 16 mats 0 to 15. When the DRAM is accessed, a read or a write operation is executed for one mat among 16 mats 0 to 15, wherein the one mat is selected with bits of X9 to X12.

First, a correspondence is made so that one of 16 mats 0 to 15 is designated by four bits of X9 to X12 among bits of X0 to X13 of row address. Moreover, when the area discriminating bit X13 is 0, a correspondence is made in such a way that one of 512 word lines in the normal area of one mat is designated by nine bits of X0 to X8. On the other hand, when the area discriminating bit X13 is 1, a correspondence is made in such a way that one of 16 word lines in the parity area of one mat is designated by four bits of X0 to X3.

According to the above-described correspondences, as shown in FIG. 3, the whole address space corresponding to one mat is covered in the normal area, but only a portion of the address space is used in the parity area. Thereby, a portion, which is not used in the parity area, of the address space becomes an indefinite area (discontinuous area). Accordingly, when the parity area is designated by setting X13 to 1, there is required a configuration in which only eight bits of X0 to X3 and X9 to X12 of the row address are used, and bits of X4 to X8, except the above bits, are excluded from count-up operation in the parity area with the later-described refresh counter 23.

Figure 4:
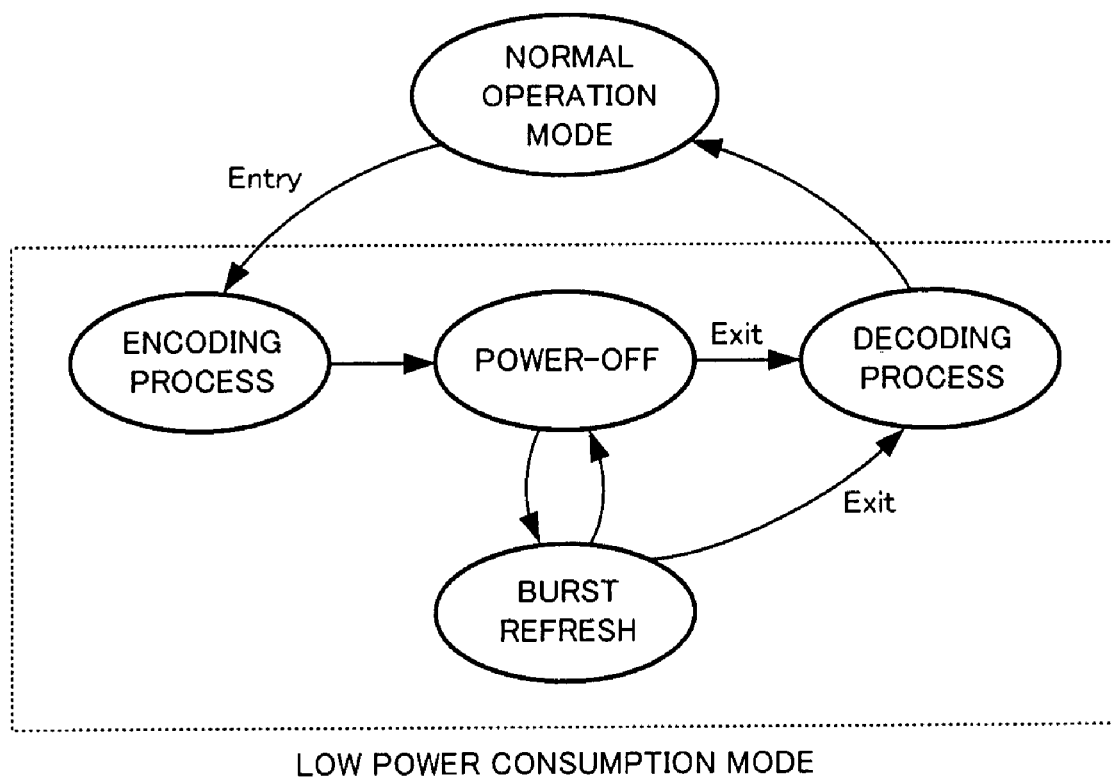
FIG. 4 is a state transition diagram showing a plurality of operation states and the functions therefore in the DRAM.

Next, FIG. 4 is a state transition diagram showing a plurality of operation states and the functions therefore in the DRAM according to the embodiment. The DRAM of the embodiment has two modes, that is, a normal operation mode (a first operation mode), which controls operations in normal state of the DRAM, and a low-power-consumption mode (a second operation mode) which controls operations of the DRAM so that power consumption is reduced in the data holding state of the DRAM. In the normal operation mode, general data is read out or written to the DRAM. On the other hand, the low-power-consumption mode realize less power consumption in the DRAM, because refresh operation in a longer period is performed, as described above while errors are detected and corrected by the codecs 16 of each memory array 10 under control of the ECC controller 203.

As shown in FIG. 4, the mode of the DRAM under the normal operation mode is changed to the low-power-consumption mode when the DRAM receives a control command Entry. On the other hand, the mode of the DRAM under the low-power-consumption mode is changed to the normal operation mode through decode process when the DRAM receives a control command Exit. The low-power-consumption mode includes three processes and one state, that is, encode process, a power-off state, burst refresh process, and decode process.

In the encode process, encoding operation is executed to generate parity bits in the row direction or in the column direction, based on the data bits of rows or columns in the memory array 10, and the parity bits are written into the parity area. In a power-off state, all unnecessary power supplies of the DRAM are stopped after completing the encode process. In the burst refresh process, the refresh operation is continuously performed for all the data in the memory array 10. The burst refresh process and the power-off state are repeated alternately for a predetermined period. In the decode process at completion of the low-power-consumption mode, decoding operation is executed, based on the parity bits held in the parity area to correct bit errors generated in the row or column direction of the memory array 10.

Figure 5:
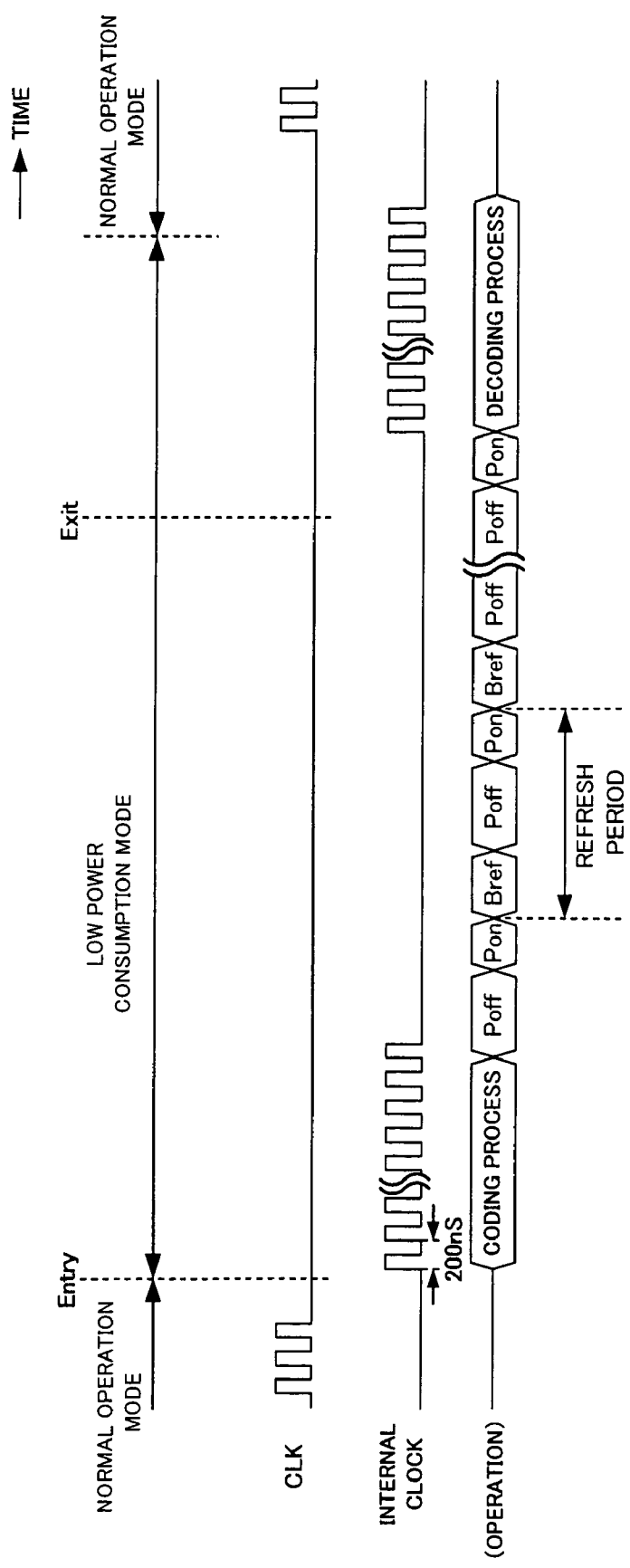
FIG. 5 is a timing flow diagram corresponding to the state transition diagram shown in FIG. 4.

Here, FIG. 5 shows a timing flow diagram corresponding to the state transition diagram shown in FIG. 4. As shown in FIG. 5, operations are controlled in the normal operation mode, using clock signals (CLK) supplied from the outside, while operations are controlled with an internal clock when the normal operation mode is shifted to the low-power-consumption mode for encode process at the timing of issuing the Entry command. At this time, the cycle of the internal clock is set longer (lower frequency) in order to realize further less power consumption in the encode process. A longer cycle of, for example, 200 nsec is used as the cycle of the internal clock.

When the encode process is completed, a power-off state (Poff), a power-on state (Pon) before refresh operation, and burst refresh process (Bref) are repeatedly executed. In this case, an interval between two adjacent burst-refresh process is equivalent to a refresh period. In the low-power-consumption mode, for example, about one second is set as a long refresh period. Finally, the timing at which the low-power-consumption mode is shifted to the normal operation mode is freely set, and, when the Exit command is issued, the low-power-consumption mode is shifted to the normal operation mode through the power-on state after the decode process is completed.

Figure 6:
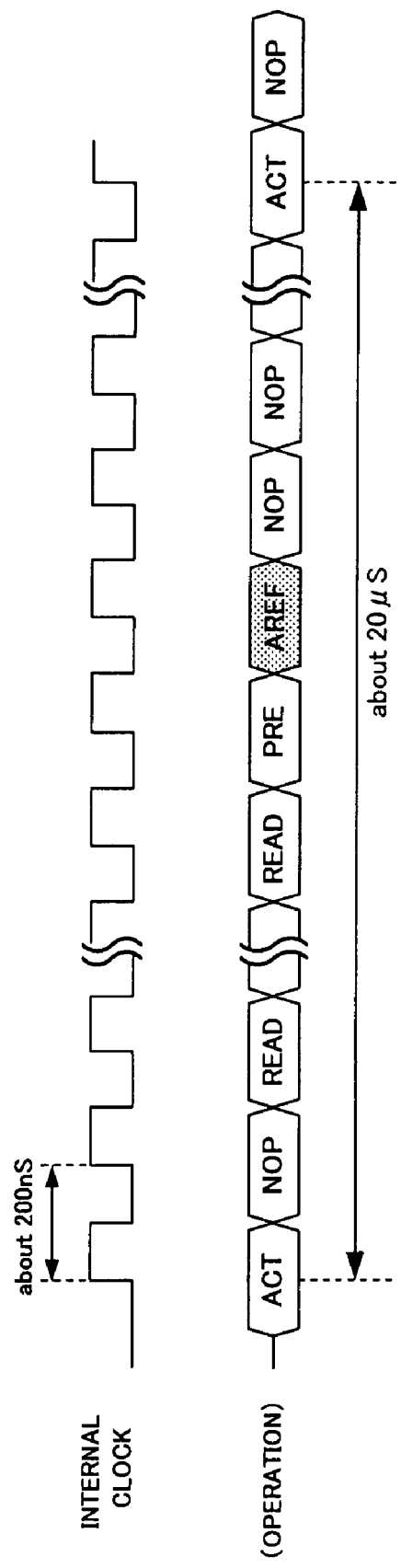
FIG. 6 is a view showing an operation flow for encode process in the timing flow diagram shown in FIG. 5.

In the low-power-consumption mode, comparatively long time is required for the encode process at the first transition because the cycle of the internal clock has been set long as described above. Thereby, even the encode process requires automatic refresh process. FIG. 6 is a view showing an operation flow for the encode process in the timing flow diagram shown in FIG. 5. FIG. 6 shows a state in which, after the encode process is started, control commands are issued in synchronization with the internal clock one by one. An ACT command by which an arbitrary row address of the memory array 10 is activated, a READ command by which data of a selected row address and a selected column address is read out, and a PRE command, by which a bank selected after reading out is pre-charged, are executed according to predetermined timing.

The interval between a predetermined ACT command and the subsequent ACT command is required to be set at about 20 μsec. Accordingly an AREF command by which the automatic refresh process is controlled is issued before the subsequent ACT command is executed after the predetermined ACT command is executed, as shown in FIG. 6. Thereby, it is assumed that the refresh counter 23 is operated during the encode process, and count-up operation for a row address in the normal area or the parity area is performed.

On the other hand, it is not preferable to disable the Exit command shown in FIG. 5, but it is required to enable the Exit command even during the encode process in order to secure rapid shift of operation modes of the DRAM. Thereby, quick shift to the normal operation mode is realized when the Exit command is issued under automatic refresh control in the encode process. In this case, there is also a possibility that, when the Exit command is executed, the refresh process is interrupted during count-up operation under a state of X13=1. Accordingly, when the refresh process is executed again thereafter, a situation that the refresh counter 23 is set in the indefinite area shown in FIG. 3 is required to be avoided. In order to meet the above-described requirement, it is effective as described later to add a function by which an area discriminating bit X13 is reset when the Exit command is executed during the low-power-consumption mode.

Figure 7:
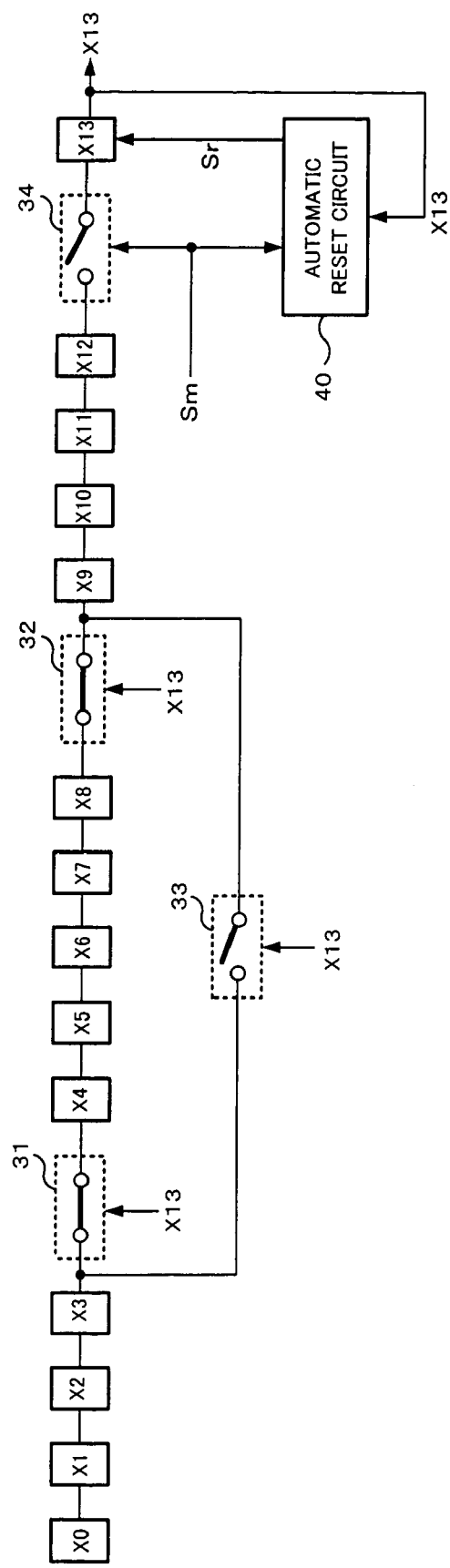
FIG. 7 is a view explaining a basic configuration of the refresh counter.

Subsequently, a configuration and operations of the refresh counter 23 will be explained with reference to FIG. 7 to 12. FIG. 7 shows a view explaining the basic configuration of the refresh counter 23. The refresh counter 23 shown in FIG. 7 is configured to be provided with one-bit counters (X0 to X13) which are connected to one another in 14 stages, four path switches 31 to 34, and an automatic reset circuit 40.

A 14-stage counter composed of above-described one-bit counters in 14-stages included in the refresh counter 23 is indicated by 14 bits of a row address X0 to X13 in the drawing, and 14 bits of X0 to X13 are output form the 14-stage counter to generate a 14-bit row address integrally. A not-shown clock is supplied to each one-bit counter corresponding to each of bits X0 to X13 (hereinafter, referred to as counters X0 to X13), and count-up operation for the row address X0 to X13 is executed one by one in synchronization with the clock.

Here, 13-stage counter of counters X0 to X12, among the counters X0 to X13, corresponds to n stage counters (n=13) according to the present invention. Moreover, the counter X13 at the final stage corresponds to the area discriminating circuit according to the invention, and outputs the area discriminating bit X13 as an area discriminating signal.

Four path switches 31 to 34 have a function which controls the conducting state of a predetermined path, and can control on-off switching according to an applied control signal. Here, three path switches 31 to 33 among these four path switches 31 to 34 corresponds to a first switching circuit according to the invention. Moreover, the path switch 34 corresponds to a second switching circuit according to the invention.

The path switch 31 is connected between the four consecutive counters X0 to X3 and the five consecutive counters X4 to X8 as shown in FIG. 7. The path switch 32 is connected between the five consecutive counters X4 to X8 and the four consecutive counters X9 to X12. The path switch 33 is connected between the output side of the counter X3 and the input side of the counter X9. The path switch 34 is connected between the four consecutive counters X9 to X12 and the final-stage counter X13.

In the embodiment, on-off control of the four path switches 31 to 34 realizes switching control between the paths in the counter structure for the row address X0 to X12 corresponding to the normal area and the row address X0 to X3 and X9 to X12 corresponding to the parity area. Here, FIG. 8 is a view showing conditions on which switching of the path switches 31 to 34 shown in FIG. 7 is controlled.

The area discriminating bit X13 is applied to the three path switches 31, 32, and 33 as a control signal. Then, the path switches 31 and 32 are controlled to be turned on in the case of X13=0, and turned off in the case of X13=1. On the other hand, the path switch 33 is controlled to be turned off in the case of X13=0, and turned on in the case of X13=1. The polarities of the path switches 31 and 32 are controlled to be the polarity of the switch 33 in reverse. Moreover, mode control signal Sm is applied to the path switch 34. Then the path switch 34 is controlled to be turned off in the case of Sm=0, and turned on in the case of Sm=1. Here, the mode control signal Sm is changed in such a way that the signal Sm is 0 during the normal operation mode, and becomes 1 during the low-power-consumption mode.

First, when X13=0 is satisfied to designate the normal area, four counters X0 to X3 are connected to the subsequent stages of five counters X4 to X8 through the path switch 31, and, at the same time, these five counters X4 to X8 are connected to the subsequent stages of four counters X9 to X12 through the path switch 32. On the other hand, the path through the path switch 33 is disconnected. Based on the above-described counter structure, 13 counters X0 to X12 are connected integrally to perform count-up operation in the address space with a size of 2-to-the-13th-power addresses in the normal area.

At this time, as assuming that the normal operation mode is set, the mode control signal Sm is 0 to cause a state in which the above-described counters X0 to X12 are disconnected from the counter X13, and the counter X13 is not changed by count-up operation with the refresh counter 23. Therefore, the count-up operation is performed only for the normal area, and is not performed for the parity area in the refresh counter 23 during the normal operation mode.

Then, when the normal operation mode is shifted to the low-power-consumption mode according to the Entry command, Sm=1 is satisfied, and the counter structure in which counters X0 to X12 and the counter X13 are connected through the path switch 34 is configured. Accordingly, when the counted area reaches the maximum range of the address space by performing count-up operation in the normal area under such a condition, the counter X13 is changed from 0 to 1, and the normal area is shifted to the parity area.

Thereby, the on-off states of the path switches 31, 32, and 33 to which the area discriminating bit X13 is applied is switched. The intermediate five counters X4 to X8 are disconnected from the preceding four counters X0 to X3 and the subsequent four counters X9 to X12. On the other hand, the preceding four counters X0 to X3 are connected directly to the subsequent four counters X9 to X12 through the path switch 33, and furthermore, are connected to the final-stage counter X13. According to the above-described structure, the nine counters X0 to X3 and X9 to X13 are connected to one another integrally, and while the counter X13 holds 1, count-up operation can be performed in the address space with a size of 2-to-the-8th-power addresses in the parity area.

Here, the state in which the path switches 31 to 34 are controlled as shown in the configuration of FIG. 7 corresponds to the state in which the normal operation mode is set. That is, switching control is performed in such a way that the path switches 31 and 32 are on, the path switch 33 is off, and the path switch 34 is off. This state corresponds to a first connected state of the first switching circuit according to the invention.

Figure 9:
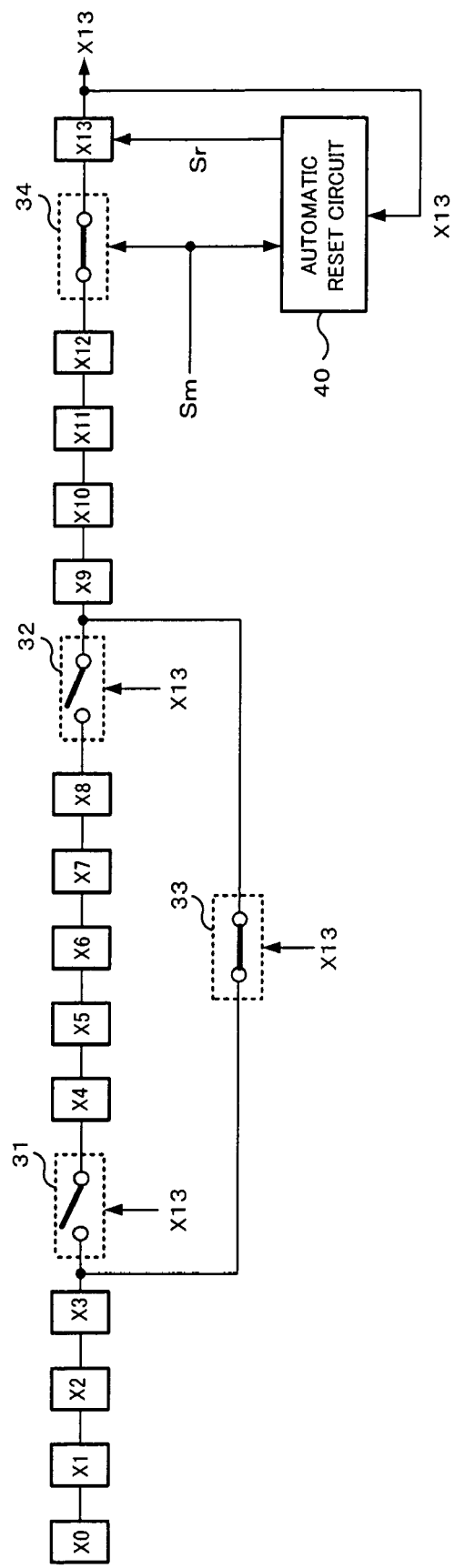
FIG. 9 is a view showing one example of the refresh counter in a connected state different from the basic configuration shown in FIG. 7.

On the other hand, FIG. 9 shows a configuration of the refresh counter 23 in the case that the counter with the same configuration shown in FIG. 7 is set in the low-power-consumption mode. Furthermore, the configuration shown in FIG. 9 is under a state of X13=1. That is, switching control is performed in such a way that path switches 31 and 32 are off, the path switch 33 is on, and the path switch 34 is on, and the connected state is that the counter portion of X4 to X8 is disconnected from the whole refresh counter 23. This state corresponds to a second connected state of the first switching circuit according to the invention.

Next, in FIG. 7, the automatic reset circuit 40 outputs a reset signal Sr to the counter X13 when the low-power-consumption mode is shifted to the normal operation mode according to the Exit command. The mode control signal Sm and the area discriminating bit X13 are applied to the automatic reset circuit 40, and timing at which a rest signal Sr is generated as one-shot pulse is controlled. This reset signal Sr resets the counter X13 to change the state of X13=1 to the state of X13=0, and thereby the address space is shifted from the parity area to the normal area. In addition, the configuration and the operations of the automatic reset circuit 40 will be described later in detail.

Figure 10:
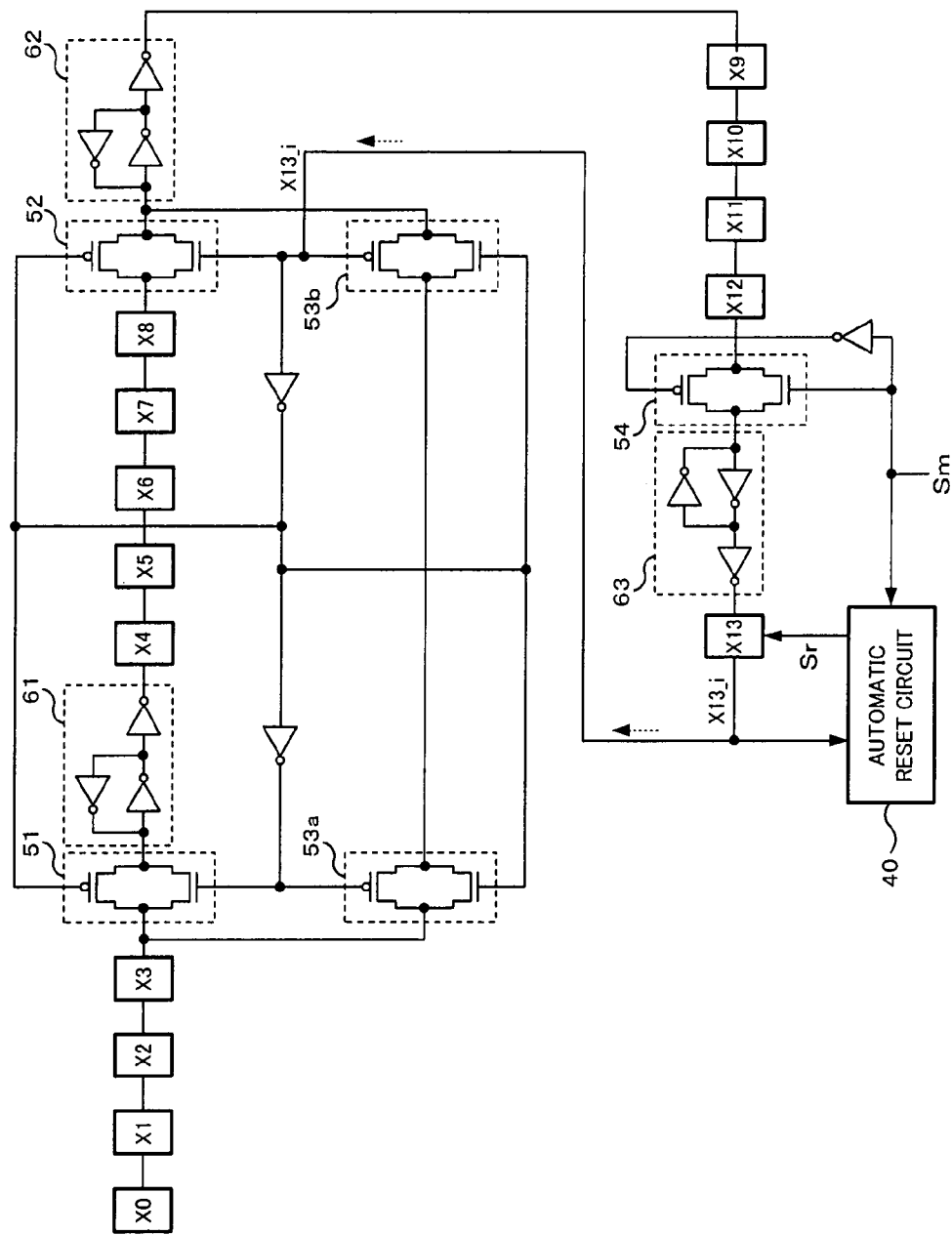
FIG. 10 is a view showing one example of a concrete configuration of the refresh counter shown in FIG. 7.

FIG. 10 shows one example of a concrete configuration of a refresh counter 23 corresponding to the basic configuration shown in FIG. 7. In the example of FIG. 10, basic operations are common to those of the configuration of FIG. 7, but the path switches 31 to 34 in FIG. 7 and the peripheral circuits thereof are realized by concrete circuit configurations using CMOS circuits.

In FIG. 10, the configurations of counters X0 to X13 in 14-stages and the automatic reset circuit 40 are common to those of the components in FIG. 7, and explanation will be eliminated. On the other hand, transfer gates 51 to 54 in FIG. 10 are used as the path switches 31 to 34 shown in FIG. 7. Here, two transfer gates 53a and 53b are used as the path switch 33, and the arrangement of the transfer gates 53a and 51 are symmetrical to that of the transfer gates 53b and 52.

Each of these five transfer gates 51 to 54 has a complementary-type configuration in which the drain of a PMOS (P-channel MOS) is connected to that of an NMOS (N-channel MOS), and the source of the PMOS is connected to that of the NMOS. And, a control signal is applied to each gate of the transfer gates 51 to 54 for switching control between the conducting state and the nonconducting state in between the source and the drain. The internal node X13_i of the area discriminating bit X13 or a signal with a reversed polarity is applied to each gate of the four transfer gates 51, 52, 53a, and 53b. The polarity of the internal node X13_i and that of the above-described area discriminating bit X13 are in reverse of each other. Moreover, the mode control signal Sm or a signal with a reversed polarity is applied to the gate of the transfer gate 54.

As shown in FIG. 10, the internal node X13_i is applied to the two transfer gates 51 and 52 which form a path for the normal area and the two transfer gates 53a and 53b which form a path for the parity area in such a way that the transfer gates 51 and 52 have polarities in reverse of those of the transfer gates 53a and 53b. Accordingly, in the case of X13_i=1, the transfer gates 51 and 52 are turned on, and the transfer gates 53a and 53b are turned off. On the other hand, in the case of X13_i=0, the transfer gates 51 and 52 are turned off, and the transfer gates 53a and 53b are turned on.

Thereby, a counter structure equivalent to that shown in FIG. 7 can be realized in response to changes in the level of X13.

Moreover, in FIG. 10, a buffer 61 for data holding is provided at the output side of the transfer gate 51, a buffer 62 for data holding is provided at the output side of the transfer gate 52, and a buffer 63 for data holding is provided at the output side of the transfer gate 54. These buffers 61 to 63 comprise three inverters, and is provided so that there is avoided a situation that the input side of each of the counters X4, X9, and X13 is turned into the floating state at the timing when each of the transfer gates 51, 52, and 53 is turned off.

Figure 11:
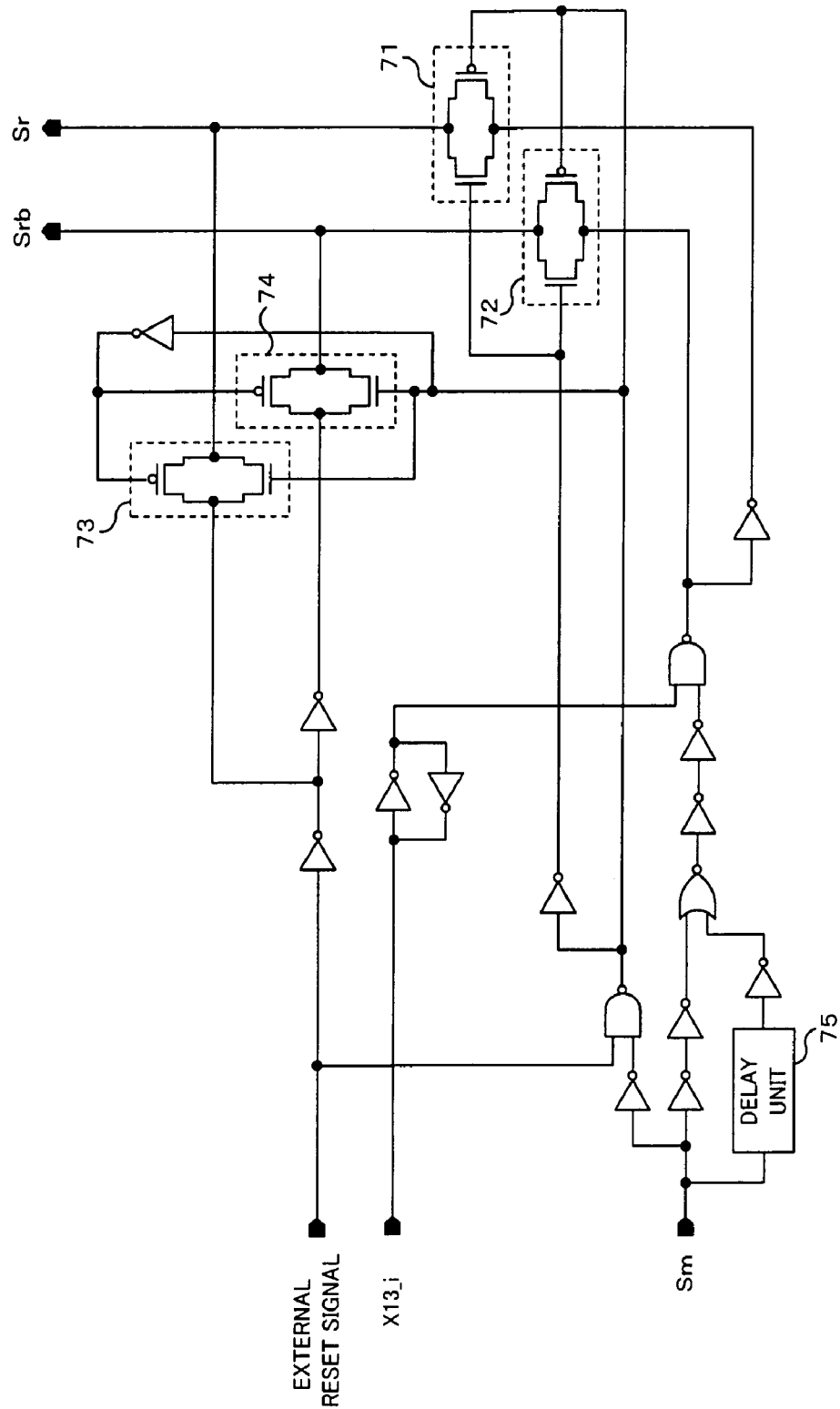
FIG. 11 is a view showing a configuration of the automatic reset circuit.

Next, the configuration and the operations of the automatic reset circuit 40 included in the refresh counter 23 will be explained. FIG. 11 is a view showing one concrete example of a configuration of the automatic reset circuit 40, and FIG. 12 is a waveform diagram for functions of the automatic reset circuit 40 shown in FIG. 11.

The automatic reset circuit 40 shown in FIG. 11 comprises transfer gates 71 to 74, a delay unit 75, a number of inverters, NAND circuits, NOR circuits, and the like. As described above, a mode control signal Sm, and an Internal node X13_i are input to the automatic reset circuit 40, and an external reset signal is further input thereto. In addition to the automatic resetting function according to the embodiment, the external reset signal, furthermore, is supplied when the counter X13 is arbitrarily reset at predetermined timing. Moreover, the above-described reset signal Sr and a reversed reset signal Srb with a polarity in reverse of the signal Sr are output from the automatic reset circuit 40.

Here, the example of the waveform diagram in FIG. 12 shows that the normal operation mode and the low-power-consumption mode are repeated alternately. First, in the normal operation mode during timing t0 through t1, the mode control signal Sm=0 and the internal node X13_i=1 are obtained, and the parity area is invalid. Under these conditions, a pulse in which the external reset signal becomes 0 for a predetermined period is input. At this time, in the configuration shown in FIG. 11, the transfer gates 71 and 72 are turned off, and, at the same time, the transfer gates 73 and 74 are turned on while the external reset signal is 0. Thereby, a reversed pulse of the external reset signal appears on the reset signal Sr as shown in FIG. 12.

Subsequently, when the normal operation mode is shifted to the low-power-consumption mode during timing t1 through t2, the mode control signal Sm=1 is obtained, and the parity area becomes valid. Thereafter, the internal node X13_i is changed between 1 and 0 as count-up operation in the address space of the parity area is performed. Moreover, It is understood that when the pulse in which the external reset signal becomes 0 for the predetermined period is input, a reversed pulse of the input pulse appears on the reset signal Sr as shown in FIG. 12 even in the low-power-consumption mode.

Then, one shot pulse is generated when, for a period during which the internal node X13_i is 0, the low-power-consumption mode is shifted to the normal operation mode during timing t2 through t3, and the mode control signal Sm is changed from 1 to 0. As shown in FIG. 11, the transfer gates 71 and 72 are turned on when the internal node X13_i becomes 0. One shot pulse is generated when the mode control signal becomes 0 under the above-described situation, and the generated shot pulse has a pulse width equivalent to delay time of the delay unit 75. Thereby, as shown in FIG. 12, the internal node X13_i is reset to 1, following the one shot pulse on the reset signal Sr. That is, as the area discriminating bit X13 at the outside becomes 0, and the normal area is changed into a state in which the normal area is designated, a situation that a malfunction is caused in the following refresh operations can be avoided.

Here, the configuration of the automatic reset circuit 40 shown in FIG. 11 is one example, and various kinds of circuit configurations can be adopted by combining logic circuits if the configuration can generate a reset signal by which the area discriminating bit X13 can be reset.

According to the DRAM of the embodiment, which has been explained above, various kinds of malfunctions can be prevented when refresh operation is executed for the normal area and the parity area, which are formed in the memory array 10. That is, in the low-power-consumption mode, for example, when refresh operation is executed for the parity area, the area discriminating bit X13 is reset by the automatic reset circuit 40 when there is caused a situation that the refresh operation is stopped. Accordingly, when the area discriminating bit X13 is referred thereafter and the normal area is indicated, a situation that the refresh counter 23 is set in an indefinite area of the parity area can be avoided. Accordingly, Exit operation can be enabled at any time in encode process for the low-power-consumption mode to enhance the convenience of the DRAM control. Moreover, when the power supply is turned off during refresh operation using a longer period, there can be prevented a situation that the refresh counter 23 is set in the indefinite area of the parity area when the normal operation mode is shifted again to the low-power-consumption mode after the power supply turns on again.

Furthermore, the area discriminating bit X13 can be reset at any time in the normal mode because the external reset signal input from the outside, other than the above-described automatic reset signal X13, is configured to be supplied to the automatic reset circuit 40. Accordingly, refresh operation can be controlled under high degree of flexibility in control and under excellent convenience.

Though the present invention has been concretely explained, based on the embodiment, the invention is not limited to the above-described embodiment, and various variations and modifications may be possible without departing from the scope of the invention. For example, the address space of the row addresses as shown in FIG. 2, and the positions of the path switches 31 to 34 as shown in FIG. 7 can be appropriately changed. In this case, the invention can be applied even to a case in which n-bit row address is used in the normal area, m-bit row address is used in the parity area, and the positions of the path switches 31 to 34 shown in FIG. 7 are set according to the above configuration.

The invention claimed is:

1. A refresh counter circuit generating a row address of a memory device during refresh operation for said memory device which has a normal area for storing data bits, and a parity area for storing parity bits used for detection and correction of error bits among said data bits, comprising;

n-stage counter which generates said row address corresponding to an address space of said normal area represented by n bits and to an address space of said parity area represented by m (m<n) bits included in said n bits;

an area discriminating circuit which is connected to said n-stage counter and generates an area discriminating signal for discriminating between count operation in said normal area and that in said parity area;

a first switching circuit which controls switching between a first connected state in which all stages of said n-stage counter are connected, and a second connected state in which a counter portion corresponding to (n−m) bits which, among said n bits, are not included in said m bits, is disconnected from a path of said n-stage counter to form a m-stage counter; and an automatic reset circuit which generates a reset signal for resetting a state of said discriminating signal so that said count operation in said normal area is discriminated by said discriminating signal, and supplies said reset signal to said area discriminating circuit, when stopping of said refresh operation is instructed under a situation that said first switching circuit controls switching to said second connected state.

2. A refresh counter circuit according to claim 1, wherein said first switching circuit controls switching to said first connected state when said count operation in said normal area is discriminated by said area discriminating signal, and said first switching circuit controls switching to said second connected state when said count operation in said parity area is discriminated by said area discriminating signal.

3. A refresh counter circuit according to claim 1 or 2, wherein a first operation mode in which said refresh operation is executed using only said row address in said normal area, or a second operation mode in which said refresh operation is executed using said row address both in said normal area and in said parity area, can be selectively instructed to said memory device, and said automatic reset circuit generates said reset signal when said operation mode is shifted from said second operation mode to said first operation mode.

4. A refresh counter circuit according to claim 3, further comprising a second switching circuit which disconnects said n-stage counter from said area discriminating circuit when said first operation mode is instructed, and connects said area discriminating circuit to final stage of said n-stage counter to form (n+1) stage counter when said second operation mode is instructed.

5. A refresh counter circuit according to claim 4, wherein said first switching circuit includes a first path switch connected between the output side of the k-th (k<m) stage and the input side of the (k+1)-th stage among said n-stage counter, a second path switch connected between the output side of the (k+n−m)-th stage and the input side of the (k+n−m+1)-th stage among said n-stage counter, and a third path switch connected between the output side of the k-th stage and the input side of the (k+n−m+1)-th stage among said n-stage counter, wherein in said first connected state, said first path switch and said second path switch are controlled to be turned on, and the third path switch is controlled to be turned off, and in said second connected state, said first path switch and said second path switch are controlled to be turned off, and said third path switch is controlled to be turned on.

6. A refresh counter circuit according to claim 5, wherein said second switching circuit includes a fourth path switch connected between the output side of the n-th stage of said n-stage counter and the input side of said area discriminating circuit, said fourth path switch is controlled to be turned off when said first operation mode is instructed, and said fourth path switch is controlled to be turned on when said second operation mode is instructed.

7. A refresh counter circuit according to claim 5 or 6, wherein each of said path switches comprises a complementary-type transfer gate including PMOS and NMOS.

8. A refresh counter circuit according to claim 1, wherein said automatic reset circuit supplies an external reset signal input from the outside, in addition to said reset signal, to said area discriminating circuit.

9. A control method for refresh operation by which a row address is generated for a memory device having a normal area storing data bits, and a parity area storing parity bits used for detection and correction of error bits among said data bits, including;
- generating said row address corresponding to an address space of said normal area represented by n bits and to an address space of said parity area represented by m (m<n) bits included in said n bits;
- generating an area discriminating bit for discriminating between count operation in said normal area and that in said parity area;
- controlling switching between a first state in which said row address of said n bits is used, and a second state in which said m-bit row-address is used wherein a row-address portion corresponding to (n−m) bits which, among said n bits, are not included in said m bits, is separated from the whole row address;
- resetting said area discriminating bit so that said count operation in said normal area is discriminated by said area discriminating bit when stopping of said refresh operation is instructed under a situation that said second state is controlled to be switched.

10. A control method for refresh operation according to claim 9, wherein said first state is controlled to be switched when said count operation in said normal area is discriminated based on said area discriminating bit, and said second state is controlled to be switched when said count operation in said parity area is discriminated based on said area discriminating bit.

11. A control method for refresh operation according to claim 9 or 10, wherein a first operation mode in which said refresh operation is executed using only said row address in said normal area, or a second operation mode in which said refresh operation is executed using said row address both in said normal area and in said parity area, can be selectively instructed to said memory device, and
- said resetting is performed when said operation mode is shifted from said second operation mode to said first operation mode.

* * * * *